(12) United States Patent
Javerliac et al.

(10) Patent No.: US 8,289,765 B2
(45) Date of Patent: Oct. 16, 2012

(54) ACTIVE STRAP MAGNETIC RANDOM ACCESS MEMORY CELLS CONFIGURED TO PERFORM THERMALLY-ASSISTED WRITING

(75) Inventors: Virgile Javerliac, Grenoble (FR);
Erwan Gapihan, Bouchemaine (FR);
Mourad El Baraji, Sunnyvale, CA (US)

(73) Assignee: Crocus Technology SA, Grenoble Cedex (FR)

( * ) Notice: Subject to any disclaimer, the term of this patent is extended or adjusted under 35 U.S.C. 154(b) by 372 days.

(21) Appl. No.: 12/708,584

(22) Filed: Feb. 19, 2010

(65) Prior Publication Data
US 2010/0208516 A1   Aug. 19, 2010

(30) Foreign Application Priority Data

Feb. 19, 2009   (EP) ..................................... 09290126
Feb. 19, 2009   (EP) ..................................... 09290127

(51) Int. Cl.
*G11C 11/14* (2006.01)
(52) U.S. Cl. ........... 365/171; 365/173; 365/50; 365/156
(58) Field of Classification Search .................. 365/171, 365/173, 50, 158
See application file for complete search history.

(56) References Cited

U.S. PATENT DOCUMENTS

| 6,950,335 | B2 | 9/2005 | Dieny et al. | |
|---|---|---|---|---|
| 7,518,897 | B2 * | 4/2009 | Nozieres et al. | 365/50 |
| 7,684,234 | B2 * | 3/2010 | Ho et al. | 365/158 |
| 8,031,519 | B2 * | 10/2011 | Javerliac et al. | 365/173 |
| 2004/0160809 | A1 * | 8/2004 | Lin et al. | 365/158 |
| 2005/0002228 | A1 * | 1/2005 | Dieny et al. | 365/171 |
| 2006/0291276 | A1 | 12/2006 | Nozieres et al. | |

FOREIGN PATENT DOCUMENTS
EP   2109111 A1   10/2009

* cited by examiner

*Primary Examiner* — Connie Yoha
(74) *Attorney, Agent, or Firm* — Pearne & Gordon LLP (57) ABSTRACT

A magnetic random access memory (MRAM) cell with a thermally assisted writing procedure comprising a magnetic tunnel junction formed from a magnetic storage layer, a reference layer, and an insulating layer inserted between the reference layer and the storage layer; and a first strap portion laterally connecting one end of the magnetic tunnel junction to a first selection transistor; wherein the cell further comprises a second strap portion extending opposite to the first strap portion and connecting laterally said one end of the magnetic tunnel junction to a second selection transistor, and in that said first and second strap portions being adapted for passing a portion of current via the first and second selection transistors. The disclosed cell has lower power consumption than conventional MRAM cells.

15 Claims, 5 Drawing Sheets

ACTIVE STRAP MAGNETIC RANDOM ACCESS MEMORY CELLS CONFIGURED TO PERFORM THERMALLY-ASSISTED WRITING

REFERENCE DATA

The subject matter of the present application relates to European non provisional patent applications, Ser. No. 09/290,126 and Ser. No. 09/290,127, filed on Feb. 19, 2009, the disclosure of which is hereby expressly incorporated herein by reference in its entirety.

FIELD

The present disclosure relates to magnetic random access memory (MRAM) and, more particularly, to magnetic tunnel junction (MTJ)-based memory cells.

DESCRIPTION OF RELATED ART

Thermally-assisted switching magnetic tunnel junction (TAS-MTJ) based MRAM cells have been described in U.S. Pat. No. 6,950,335 and U.S. patent application No. 2006/291276, while single-line (SL) TAS-MT based MRAM cells have been described in European patent application No. 2,109,111 by the present applicant. These typical implementations use one dedicated conductor field line per bit line or per word line.

Figure 1:
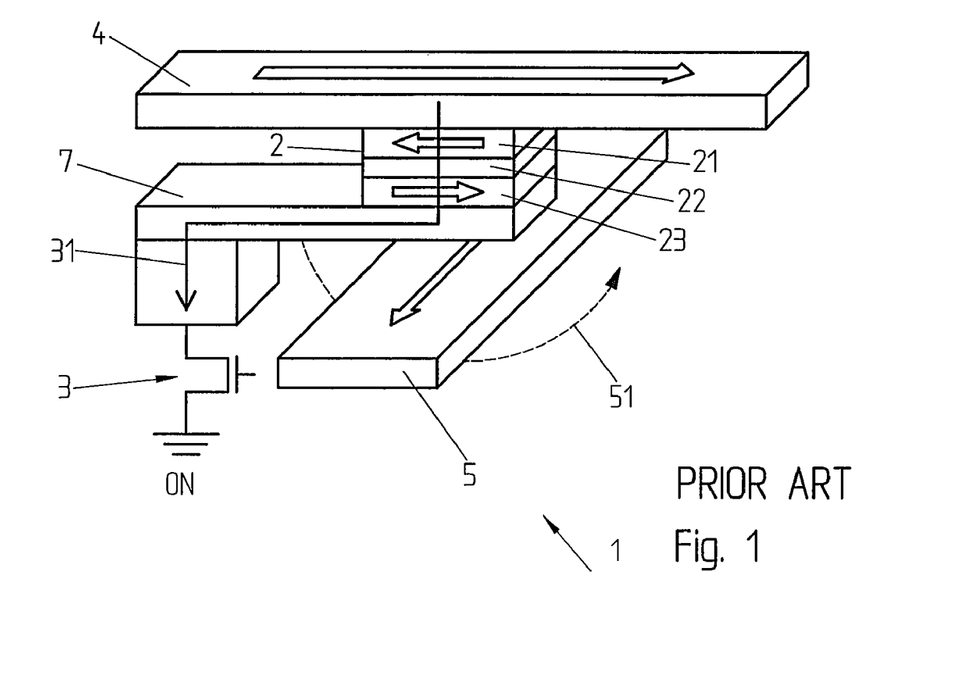
FIG. 1 shows a single memory cell 1 of a conventional MRAM cell.

FIG. 1a shows a single memory cell 1 of a conventional TAS-MTJ based MRAM comprising a junction 2, typically comprising a storage layer 23, an insulating layer 22 and a reference layer 21, and placed between a selection CMOS transistor 3 and a bit line 4, represented parallel to the page. Also orthogonal with the bit line 4, a field (writing) line 5 is placed underneath the junction 2. This configuration requires a strap 7 laterally connecting the bottom of the junction 2 and the selection transistor 3.

The writing procedure of the TAS-MTJ based MRAM is performed by heating the junction 2 with a heating current 32 pulsed through the bit line 4 and the junction 2. This is achieved when the transistor 3 is in the saturated mode. Simultaneously or after a short time delay, once the junction 2 has reached a suitable temperature, a field current 52 is passed through the field line 5, producing a magnetic field 51 capable of addressing the junction 2 by switching the magnetization of the storage layer 23 into the appropriate direction. The heating current 32 is then turned off by setting the selection transistor 3 in a blocked mode. The field current 52 is maintained during the cooling of the junction 2, and then switched off, once the junction 2 has reached a temperature where the magnetization of the storage layer 23 is frozen in the written state.

One major drawback of the conventional cell configuration of FIG. 1 is that it is necessary to have the resistance-area product (RA) of the junction 2 that is sufficiently small in order to flow a heating current 32 through the junction 2 which is sufficiently high to raise the temperature of the storage layer 23 above its blocking temperature but yet keep the power density low and be as far as possible from the voltage breakdown. For example, in order to force a current density in the range of $10^5$ A/cm$^2$ to $10^7$ A/cm$^2$, typically required to raise the temperature of the junction up to about 120 to 200° C., lying between the blocking temperature of the storage layer 23 and the one of the reference layer 21, the RA value should be of the order of 1 to 500 $\Omega.\mu m^2$.

SUMMARY

The present application discloses a magnetic random access memory (MRAM) memory cell with a thermally-assisted switching writing procedure and magnetic memory device which overcome at least some limitations of the prior art.

According to the embodiments, a MRAM cell with a thermally assisted writing procedure comprising a magnetic tunnel junction formed from a magnetic storage layer, a reference layer, and an insulating layer inserted between the reference layer and the storage layer; and a first strap portion laterally connecting one end of the magnetic tunnel junction to a first selection transistor; wherein the cell further comprises a second strap portion extending opposite to the first strap portion and connecting laterally said one end of the magnetic tunnel junction to a second selection transistor, and in that said first and second strap portions being adapted for passing a portion of current via the first and second selection transistors In an embodiment, said portion of current comprises a heating current for heating said magnetic tunnel junction to a high temperature threshold.

In another embodiment, said portion of current further comprises a field current adapted to generate a magnetic field for aligning the magnetization of the storage layer in accordance with the polarity of the field current.

In yet another embodiment, the MRAM cell further comprises a field line adapted to pass a field current for aligning the magnetization of the storage layer in accordance with the polarity of the field current.

In yet another embodiment, the MRAM cell further comprises a bit line connected to the other end of the magnetic tunnel junction and adapted to pass a spin-polarized write current across the magnetic tunnel junction, via at least one of the selection transistors, for aligning the magnetization of the storage layer in accordance with the flow direction of the spin polarized write current.

The present application also pertains to a method for writing in the MRAM cell comprising, during a writing procedure, passing a heating current in said first and second strap portions via the first and second selection transistors for heating said magnetic tunnel junction to a high temperature threshold; after the magnetic tunnel has reached the high temperature threshold, switching the magnetization of the storage layer.

In an embodiment, said switching the magnetization of the storage layer comprises passing a field current in said first and second strap portions via the first and second selection transistors.

The disclosed MRAM cell allows for a more effective heating of the junction and storage layer and for a faster switching speed. Moreover, the MRAM cell has lower power consumption and permits the use of a junction with high RA values, improving the cell reading performance.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 2A:
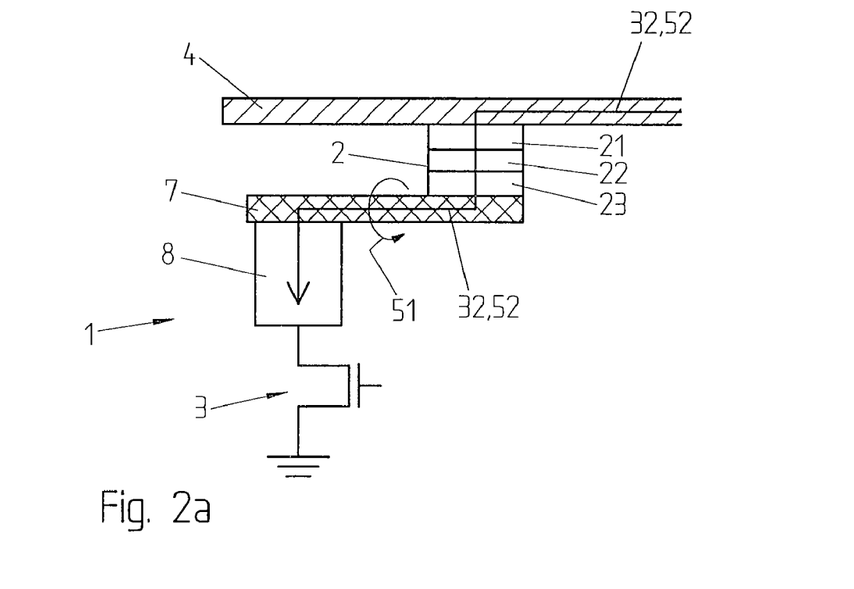
FIG. 2a illustrates a MRAM cell according to a first embodiment.

FIG. 2a shows a magnetic random access memory (MRAM) memory cell 1 with a thermally-assisted switching writing procedure according to an embodiment. The cell 1 comprises a junction 2 containing a magnetic storage layer 23, a reference layer 21 and an insulating layer 22, inserted between the reference layer 21 and the storage layer 23. A first strap portion 7 connects laterally one end of the magnetic tunnel junction 2, for example, on the side of the storage layer 23, to the selection transistor 3 via a first contact area stud 8. The cell 1 can also comprise a bit line 4, represented parallel to the page, electrically connected to the other end of the magnetic tunnel junction 2, for example, on the side of the reference layer 21. The first strap portion 7 extends in a plane parallel to the one of the bit line 4.

In this configuration, the first strap portion 7 can be used as a local field line. Here, during a writing procedure, a heating current 32 is passed through the magnetic tunnel junction 2 via the bit line 4 and the selection transistor 3 such as to heat the magnetic tunnel junction 2. This is achieved when the transistor 3 is in the saturated mode (ON). Simultaneously or after a short time delay, once the junction 2 has reached a high temperature threshold, a field current 52 is passed through the junction 2 and the strap 7, via the bit line 4. The field current 52 has a magnitude sufficient to generate a magnetic field 51 capable of switching the magnetization of the storage layer 23 into in a direction that depends on the polarity of the current 52. The heating current 32 and field current 52 are then turned off by setting the selection transistor 3 in a blocked mode (OFF).

In the cell configuration of FIG. 2a, both the heating current 32 and field current 52 pass through the junction 2 and the strap 7 and the two currents cannot be controlled independently from each other. Consequently, the total current, or the sum of the heating current 32 and field current 52, passing through the junction 2 and the strap 7 needs to be bidirectional in order to be able to reverse the direction of the magnetic field 51. This can be achieved by reversing the voltage polarity between the bit line 4 and the strap contact 8.

For a given voltage, the insulating layer 22 of the magnetic tunnel junction 2 must be made thin enough such that the field current 52 flowing in the strap 7 has a magnitude high enough to generate the magnetic field 51 capable of switching the magnetization of the storage layer 23. For example, in order to use the field current 52 with a useful magnitude ranging between 150 μA and 200 μA, the insulating layer 22 having a cross section of about $7.85 \times 10^{-11}$ cm$^2$, typical for today's magnetic tunnel junctions, must have a thickness in the order of 1.2 nm (with a resistance typically comprised between about 1 Ωμm$^2$ and 100 Ωμm$^2$). However, such a thin insulating layer 22 results in a low resistance to the total current flowing through the junction 2 and, consequently, to less heating in comparison with a junction having a thicker insulation layer 22.

The total current flowing through the magnetic tunnel junction 2 of the MRAM cell (1) of FIG. 2a can be approximated as being substantially equal to the heating current 32 in the case where the heating current 32 is much greater than the field current 52, and substantially equal to the field current 52 in the case the field current 52 is much greater than the heating current 32.

Figure 2B:
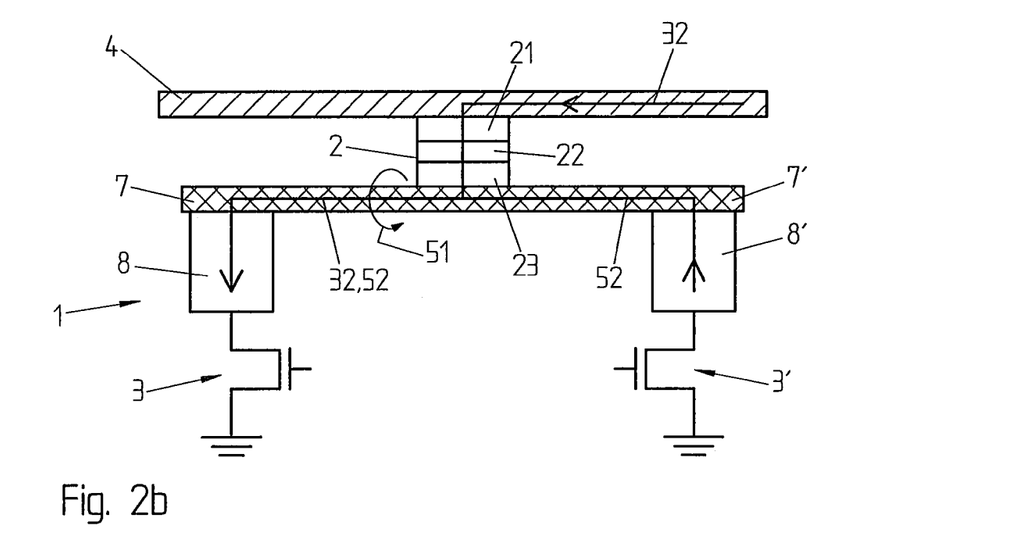
FIG. 2b illustrates the MRAM cell according to a second embodiment.

In FIG. 2b, the MRAM cell 1 is shown according to another embodiment. In the example of FIG. 2b, the cell (1) further comprises a second strap portion 7' and a second selection transistor 3', the second strap portion 7' connecting laterally the one end of the magnetic tunnel junction 2 to the second selection transistor 3' via a second contact area stud 8'. The second strap portion 7' extends opposite to the first strap portion 7, in a plane parallel to the one of the bit line 4.

Similarly to the cell configuration of FIG. 2a, the writing procedure comprises heating the magnetic tunnel junction 2 by passing the heating current 32 through the junction 2 via the bit line 4, when at least one of the selection transistors 3, 3' is ON. In the embodiment of FIG. 2b, however, switching the magnetization of the storage layer 23 is achieved by passing a portion of current, here the field current 52, in the first and second strap portions 7, 7', via the first and second selection transistors 3, 3'. This is performed by setting the two selection transistors 3, 3' in the ON mode, simultaneously or after a short time delay, once the magnetic tunnel junction 2 has reached the high temperature threshold. After the magnetization of the storage layer 23 has been switched to its final written state, the heating current 32 is turned off by turning off the selection transistor 3. The field current 52 can be maintained during the cooling of the junction 2, and then switched off, once the junction 2 has reached a low temperature threshold, where the magnetization is frozen in the written state. The cell configuration of FIG. 2b allows for controlling the field current 52 independently from the heating current 32. The polarity of the field current 52 can be changed by reversing the voltage polarity between the two strap contacts 8 in order to be able to switch the magnetization of the storage layer 23 in the two opposite directions.

The cell configuration of FIG. 2b allows using the heating current 32 with a magnitude that is lower than the one of the field current 52. The field current 52 can also contribute to the heating of the junction 2 but this contribution is normally low since the first and second strap portions 7, 7' are essentially conductive and produces a negligible amount of joule heating with the typical magnitudes of the field current 52 (about 1-10 mA).

Figure 2C:
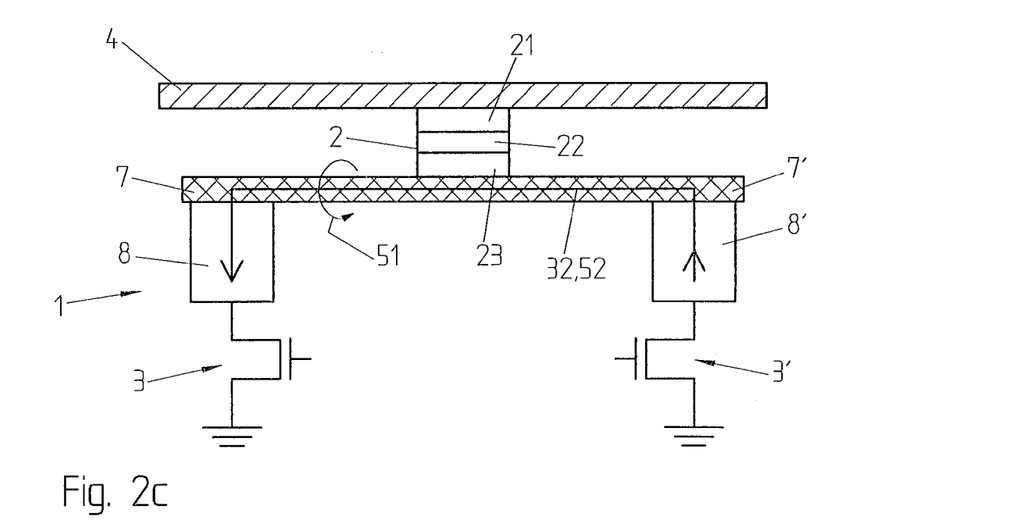
FIG. 2c illustrates the MRAM cell according to a third embodiment.

FIG. 2c illustrates the MRAM cell 1 according to yet another embodiment. In FIG. 2c, the writing procedure comprises passing the portion of current in the first and second strap portions 7, 7' where the portion of current comprises the heating current 32 and the field current 52. In the configuration of FIG. 2c, the magnetic tunnel junction 2 is heated essentially by the joule effect contribution due to the heating current 32 passing through the two strap portions 7, 7'.

In a variant of the embodiment, heating is increased by increasing the resistivity of the two strap portions 7, 7'. This can be achieved by reducing the cross section of the two strap portions 7, 7', for example, by increasing their length and/or decreasing their thickness. For example, the shape of the first and second strap portion 7, 7' can be changed from its usually square shape into a narrow rectangular shape. The cross section of the two strap portions 7, 7' can be made smaller than $3 \times 10^{-11}$ cm$^2$, resulting in a sheet resistance above 200 Ω/square.

Decreasing the cross section of the first and second strap portions 7, 7', for example in the order of $3 \times 10^{-11}$ cm$^2$, allows for passing a small field current 52 in the two strap portions 7, 7', for example comprised between 150 uA and 200 uA, resulting in a field current density high enough to generate a magnetic field intensity able to switch the storage magnetization. Moreover, the distance between the two strap portions 7, 7' and the storage layer 23 in the cell configuration of FIG. 2c is significantly smaller than the one between the field line 5 and the storage layer 23 in the conventional cell configuration of FIG. 1, since the two strap portions 7, 7' are in close vicinity with the storage layer 23. For example, the distance between the two strap portions 7, 7' and the storage layer 23 can be as small as 50 nm (compared to about typically 200 nm in the case of the conventional cell of FIG. 1). Consequently, the field current 52 flowing within the first and second strap portion 7, 7' of the cell configuration of FIG. 2c will produce a larger magnetic field intensity within the storage layer 23 than the one produced, for example by passing a current in field line 5 or bit line 4 of the cell configuration of FIG. 1, for the same field current magnitude.

Increasing the resistivity of the two strap portions 7, 7' can also be achieved, alternatively or in combination with the smaller cross section, by utilizing a resistive material for the strap portions 7, 7'. For example, the two strap portions 7, 7', normally made of tantalum having a sheet resistance of 106 Ω/square, can be made of a material having a sheet resistance above 200 Ω/square. In an exemplary embodiment, the two strap portions 7, 7' are made of tantalum nitride, having a sheet resistance of 223 Ω/square.

The heating current 32 and field current 52 in the cell configuration of FIG. 2c cannot be controlled independently. However, unlike the cell configuration of FIG. 2a, the present cell configuration does not show the usual limitations in current intensity such as electromigration or voltage breakdown, since no current flows through the junction 2.

The total current flowing through the first and second strap portion 7, 7' of FIG. 2c, corresponding to the sum of the heating current 32 and the field current 52, can be approximated as being substantially equal to the heating current 52 in the case the heating current 32 is much greater than the field current 52, and substantially equal to the field current 52 in the case the field current 52 is much greater than the heating current 32.

In another embodiment, at least part of the storage layer 23 can be comprised within the two strap portions 7, 7' themselves. In an exemplary embodiment not represented, the storage layer 23 is located within the two strap portions 7, 7', on the side of the strap portions 7, 7' being connected with the magnetic tunnel junction 2. This latter configuration facilitates the heating of the storage layer 23 since it is located within the two strap portions 7, 7', where the heating due to joule effect contribution is taking place.

In yet another embodiment not represented, the first and second strap portions 7, 7' are oriented parallel to the plane of the bit line 4 but perpendicular to the bit line 4, allowing perpendicular orientation of the magnetization of the storage layer 23.

Figure 2D:
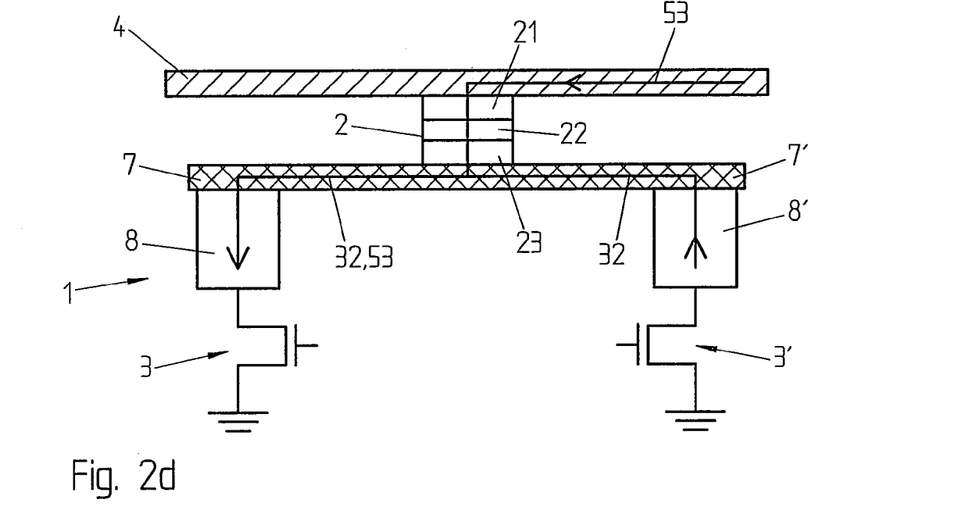
FIG. 2d illustrates the MRAM cell according to a fourth embodiment.

FIG. 2d illustrates the MRAM cell 1 according to yet another embodiment. In FIG. 2d, the writing procedure comprises heating the magnetic tunnel junction 2 by passing the heating current in the first and second strap portions 7, 7'. Switching the magnetization of the storage layer 23 is performed after the magnetic tunnel has reached the high temperature threshold, by passing a spin polarized write current 53 through the magnetic tunnel junction 2, via the bit line 4 when at least one of the selection transistors 3 in ON. More particularly, the spin-polarized current 52 becomes polarized when passing through the reference layer 21 according to the current flow direction, so that the spins of the electrons penetrating into the storage layer 23 are in majority oriented along the magnetization direction of the reference layer 21. The spin-polarized current then switched the magnetization of storage layer 23. The heating of the junction 2 is performed by passing the heating current 32 through the strap 7, between the two strap contacts 8. Here, the resistivity of the strap 7 can be increased by reducing its cross section or by using a more resistive material, as discussed in the embodiment of FIG. 2c.

In a variant of the embodiment not represented, the magnetic tunnel junction 2 comprises an additional write current polarizing magnetic layer, for example, added on the side of storage layer 23 and separated from it by a non-magnetic layer of small resistivity. The spin-polarized current 52 becomes polarized when passing through polarizing magnetic layer according to the current flow direction, so that the spins of the electrons penetrating into the storage layer 23 are in majority oriented along the magnetization direction of the polarizing magnetic layer.

In another variant of the embodiment, the storage layer 23 is made of an amorphous or nanocrystallized alloy based on a rare earth and on a transition metal, such as described in U.S. Pat. No. 7,332,781 by the present applicant. The magnetic order of said alloy can be of ferrimagnetic type and the storage layer 23 can have a substantially planar magnetization. The use of amorphous or nanocrystallized alloy permits to significantly decrease the spin-polarized current density required for the writing procedure, in order to avoid electric breakdown of the magnetic tunnel junction 2 and minimize the electric consumption of the memory.

An advantage of using the spin-polarized write current 53 is that the current density necessary for switching of magnetization of the storage layer 23 is no longer subject to the switching field, which is an extrinsic property of the material, and thus dependent on its geometry and on the possible presence of defects. Instead, the spin-polarized current density depends to the magnetic anisotropy of the storage layer 23, which is an intrinsic property of the material and thus a priori controllable in much easier fashion. In particular, it is independent from the size and shape of the magnetic tunnel junction 2, and thus the critical spin-polarized current density remains constant when the junction size decreases, as expected in future product generations. In contrast, in state of the art MRAM cells using magnetic field generated by current lines, the current necessary to the writing, and thus the consumption, increases as the magnetic tunnel junction size decreases.

Figure 2E:
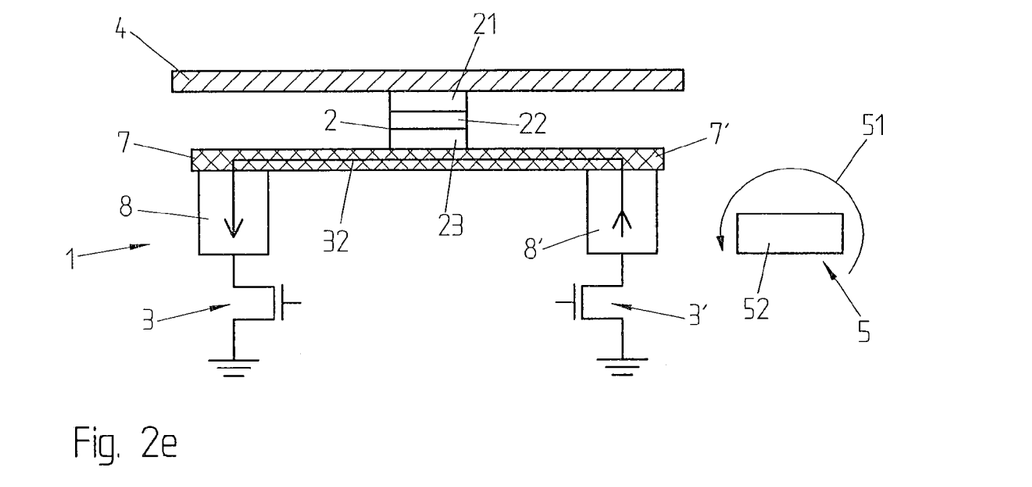
FIG. 2e illustrates the MRAM cell according to a fifth embodiment.

FIG. 2e shows the MRAM memory cell 1 according to yet another embodiment. In FIG. 2e, the MRAM cell 1 further comprises a field line 5. The writing procedure comprises heating the magnetic tunnel junction 2 by passing the heating current in the first and second strap portions 7, 7'. Switching the magnetization of the storage is performed after the magnetic tunnel has reached the high temperature threshold, by passing the field current 52 in the field line 5. Similarly to the MRAM cell 1 of FIG. 2b, the field current 52 can be controlled independently from the heating current 32, and it is possible to turn off the heating current 32 while continuing to flow the field current 52, during the writing procedure.

The use of the field line 5 results in higher power consumption compared to the cell configuration of FIG. 2c, since a higher field current 52 must be used due to the greater distance between the field line 5 and the storage layer 23. However, since the field current 52 is flowing in the separate field line 5, there is no need to reverse the voltage polarity between the two strap contacts 8 or between the bit line 4 and the strap contact 8, as it is the case in the previous embodiments. Consequently, no additional transistor is required to perform this task, allowing for a simpler cell design.

In a variant of this embodiment not represented, the MRAM cell 1 comprises two or more magnetic tunnel junctions 2 and the field line 5 is shared between the junctions 2, similarly to the cell configuration described in patent application WO 2009/153292 by the present applicant. This variant allows for reducing significantly the size of a memory array formed from a plurality of the MRAM cells 1 according to the embodiment of FIG. 2e, and for lower power consumption in comparison with conventional MRAM cells.

A reading procedure of the MRAM cell 1 according to any of the embodiments of FIGS. 2b to 2e can be performed by passing a small sense current through the magnetic tunnel junction 2, via the bit line 4 in order to measure the magnetoresistance of the magnetic tunnel junction.

The MRAM cells 1 according to the embodiments of FIGS. 2a, 2b and 2c, where the field current 52 passes in the first strap portion 7 and in the first and second strap portions 7, 7', respectively, allow for faster switching speed of the magnetic field 51, compared to the MRAM cell 1 according to the embodiment of FIG. 2e. Indeed, the parasitic capacitance of the strap portions 7, 7' due to passing a current is much smaller than the one of the field line 5. The difference in switching speed between the MRAM cells 1 according to the embodiments of FIGS. 2a, 2b and 2c and the MRAM cell 1 according to the embodiment of FIG. 2e can be important even if the sheet resistance of the strap portions 7, 7' is high, since the length of the strap portions 7, 7' usually used in cell configurations of FIGS. 2a to 2c is small and its corresponding IR drop and RC remain low. The difference is significant when long field lines 5 are used in cell configurations of FIG. 2e, especially in memory arrays comprising a large number of the MRAM cell 1. Moreover, MRAM cells 1 according to the embodiments of FIGS. 2a to 2c have lower power consumption than conventional MRAM cells, since low magnitude field and heating currents 52, 32 can be used to effectively switch the magnetization of the storage layer 23 and heat the magnetic tunnel junction 2, respectively.

MRAM cells 1 according to the embodiments of FIGS. 2c and 2e can use a magnetic tunnel junction 2 with a high RA value, since none of the heating current 32 and field current 52 flows through the magnetic tunnel junction 2. In these configurations, the insulating layer 22 can be made of MgO yielding a tunnel magnetic resistance (TMR) of the magnetic tunnel junction 2 of up to 250%. In contrast, conventional magnetic tunnel junctions comprising an $Al_2O_3$-based insulating layer have TMR of typically 70%. High RA value allows for a better noise margin and reading/sensing speed. Indeed, with high RA values, the resistance of the strap portions 7, 7' becomes negligible compared to the resistance of the magnetic tunnel junction 2, and have no significant influence on the TMR of the magnetic tunnel junction 2. The properties of the magnetic tunnel junction 2 in MRAM cells 1 according to the embodiments of FIGS. 2c and 2e can then be optimized to, for example, improve read operation. Another advantage of the MRAM cells 1 according to the embodiments of FIGS. 2c and 2e is the increased reliability of the magnetic tunnel junction 2, and thus the MRAM cell 1. Indeed, effects such as electromigration, voltage breakdown, or oxide degradation in the magnetic tunnel junction 2 will be minimized in the absence of current flowing through the junction 2.

In the case of the MRAM cells 1 according to the embodiments of FIGS. 2a to 2d, despite no field line 5 is required, the size of the MRAM cell 1 will be larger in respect with the one of the conventional MRAM cells, since it requires an additional transistor (not shown) in order to control the field and/or heating currents 52, 32 in the strap portions 7, 7'. The MRAM cells 1 according to the embodiments of FIGS. 2b to 2e also require the second strap portion 7' and second contact area stud 8'.

Figure 3:
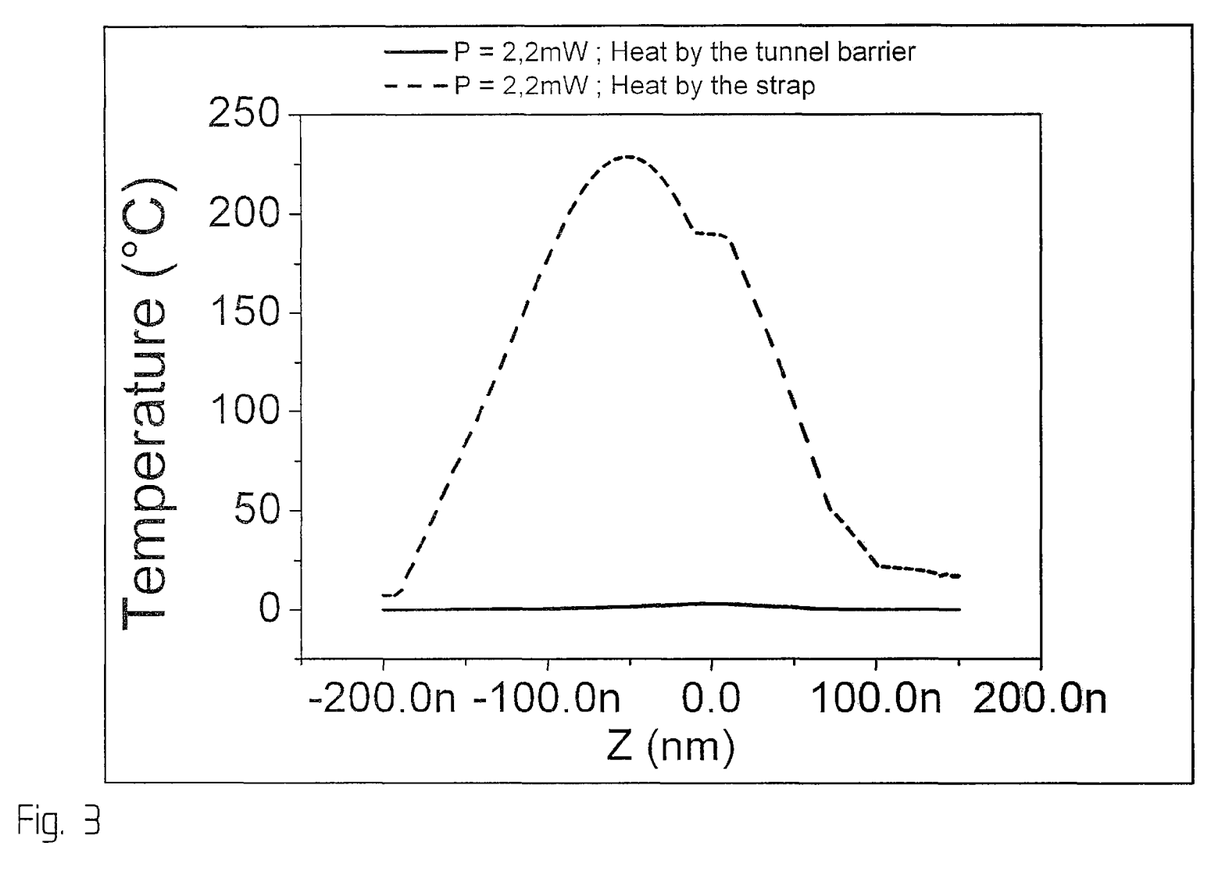
FIG. 3 represents simulated temperature variation plotted as a function of a position along a magnetic tunnel junction and strap portions of the MRAM cell 1 according to the embodiments.

In FIG. 3, the simulated temperature variation is plotted as a function of the position Z along the magnetic tunnel junction 2 and the strap portions 7, 7', for the MRAM cell 1 according to the embodiments of FIGS. 2a and 2b (plain line) and the embodiments of FIGS. 2c, 2d and 2e. The simulation was performed using finite elements and assuming a heating power of 2.2 mW. In the case of the MRAM cell 1 according to the embodiments of FIGS. 2c and 2d, it is assumed that the storage layer 23 is placed within the strap portions 7, 7'. In FIG. 3, the position Z=0 corresponds to the intersection between the storage layer 23 and the strap portions 7, 7', and the Z values between 0 et −100 correspond to positions along the storage layer 23.

Figure 4:
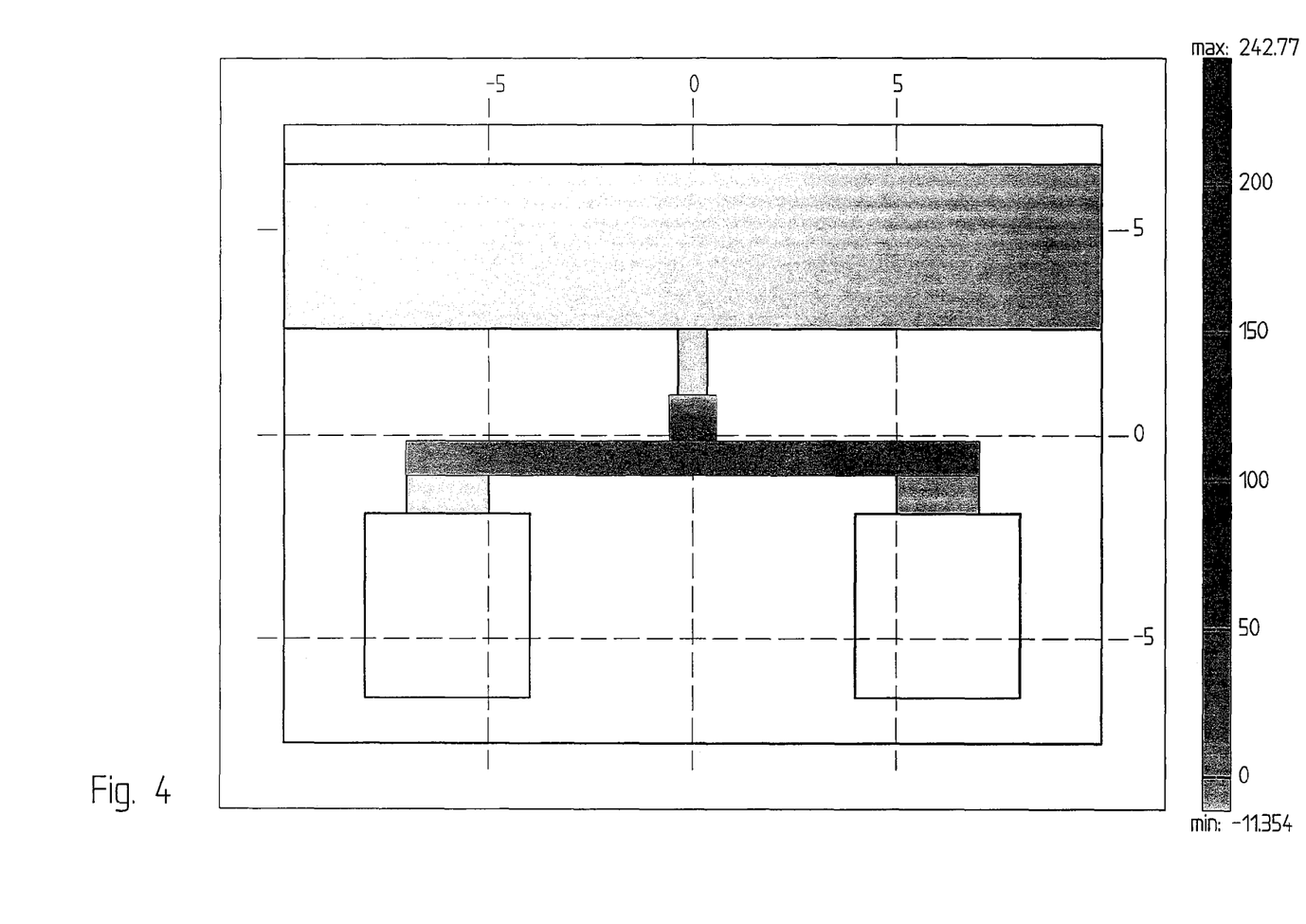
FIG. 4 represents simulated two-dimensional temperature profiles for the MRAM cell 1 according to the embodiments of FIGS. 2c and 2d.

In FIG. 4, the simulated temperatures of FIG. 3 are represented as two-dimensional temperature profiles for the MRAM cell 1 according to the embodiments of FIGS. 2c and 2d. As can be seen on FIG. 4, the maximum temperature (shown in black) is attained in the vicinity of the intersection of the magnetic tunnel junction 2 and the strap portions 7, 7'. A temperature scale represented on the right side of FIG. 4 give the correspondence between the temperature profile and the temperature values in ° C.

As shown in FIG. 3 in the case of MRAM cell 1 according to the embodiment of FIGS. 2a and 2b, the heating of the magnetic tunnel junction 2 is essentially negligible when a heating power of 2.2 mW is applied. In the case of the MRAM cell 1 according to the embodiment of FIGS. 2c and 2d, the temperature attains values comprised between 120° C. and 200° C. within the storage layer 23, temperatures that are above typical blocking temperature, or high threshold temperature, of the storage layer 23. The maximum temperature is reached well within to the storage layer 23. The location of the maximum temperature is due to the lesser diffusion of heat within the magnetic tunnel junction 2 than within the strap portions 7, 7' that has a much larger volume than the magnetic tunnel junction 2 itself.

The simulations of FIGS. 3 and 4 show that the magnetic tunnel junction 2 can be heated more effectively by passing the heating current 32 through the strap portions 7, 7'. Indeed, a lower heating power, or heating current 32, is required to heat the magnetic tunnel junction 2 in order to reach the blocking temperature. The strap portions 7, 7' can be made more resistive and heat more due to the joule effect than the magnetic tunnel junction 2, by changing the geometry of the strap portions 7, 7' and/or placing the storage layer 23 within the strap portions 7, 7', as described above.

The disclosure is susceptible to various modifications and alternative forms, and specific examples thereof have been shown by way of example in the drawings and are herein described in detail. It should be understood, however, that the disclosure is not to be limited to the particular forms or methods disclosed, but to the contrary, the disclosure is to cover all modifications, equivalents, and alternatives.

A magnetic memory device (not represented) can be formed from a plurality of MRAM cells 1 according to any of the embodiments of FIGS. 2a to 2e.

| Reference Numbers and Symbols | |
|---|---|
| 1 | Memory cell |
| 2 | Magnetic tunnel junction |
| 23 | Storage layer |
| 22 | Insulating layer |
| 21 | Reference layer |
| 3 | First selection transistor |
| 3' | Second selection transistor |
| 32 | Heating current |
| 4 | Bit line |
| 5 | Field line |
| 51 | Magnetic field |
| 52 | Field current |
| 53 | Spin polarized write current |
| 7 | First strap portion |
| 7' | Second strap portion |
| 8 | First contact area stud |
| 8' | Second contact area stud |
| RA | resistance-area product |
| TMR | tunnel magnetic resistance |
| Z | position along the junction |

What is claimed is:

1. A magnetic random access memory (MRAM) cell with a thermally assisted writing procedure comprising
a magnetic tunnel junction formed from a magnetic storage layer, a reference layer, and an insulating layer inserted between the reference layer and the storage layer; and
a first strap portion laterally connecting one end of the magnetic tunnel junction to a first selection transistor;
wherein the cell further comprises a second strap portion extending opposite to the first strap portion and connecting laterally said one end of the magnetic tunnel junction to a second selection transistor,
and in that said first and second strap portions being adapted for passing a portion of current via the first and second selection transistors,
wherein said portion of current comprises a heating current for heating said magnetic tunnel junction to a high temperature threshold.

2. The cell according to claim 1, wherein the first and second strap portions have a sheet resistance above 200 Ω/square.

3. The cell according to claim 2, wherein the first and second strap portions have a cross section smaller than $3 \times 10^{-11}$ cm$^2$.

4. The cell according to claim 2, wherein the first and second strap portions are made of tantalum nitride.

5. The cell according to claim 1, wherein the first and second strap portions connect the magnetic tunnel junction on the side of the storage layer.

6. The cell according to claim 1, wherein at least part of the storage layer is comprised within the first and second strap portion.

7. The cell according to claim 1, wherein said portion of current further comprises a field current adapted to generate a magnetic field for aligning the magnetization of the storage layer in accordance with the polarity of the field current.

8. The cell according to claim 1, wherein said portion of current comprises a field current adapted to generate a magnetic field for aligning the magnetization of the storage layer in accordance with the polarity of the field current.

9. The cell according to claim 1, further comprising a field line adapted to pass a field current for aligning the magnetization of the storage layer in accordance with the polarity of the field current.

10. The cell according to claim 1, further comprising a bit line connected to the other end of the magnetic tunnel junction and adapted to pass a spin-polarized write current across the magnetic tunnel junction, via at least one of the selection transistors, for aligning the magnetization of the storage layer in accordance with the flow direction of the spin polarized write current.

11. A magnetic memory device comprising a matrix containing a plurality of magnetic random access memory (MRAM) cells with a thermally assisted writing procedure, each cell comprising a magnetic tunnel junction formed from a magnetic storage layer, a reference layer, and an insulating layer inserted between the reference layer and the storage layer; a first strap portion laterally connecting one end of the magnetic tunnel junction to a first selection transistor; and a second strap portion extending opposite to the first strap portion and connecting laterally the one end of the magnetic tunnel junction to a second selection transistor; said first and second strap portions being adapted for passing a portion of current via the first and second selection transistors, wherein
said portion of current comprises a heating current for heating said magnetic tunnel junction to a high temperature threshold.

12. A method for writing in a magnetic random access memory (MRAM) cell with a thermally assisted writing procedure comprising a magnetic tunnel junction formed from a magnetic storage layer, a reference layer, and an insulating layer inserted between the reference layer and the storage layer; a first strap portion laterally connecting one end of the magnetic tunnel junction to a first selection transistor; and a second strap portion extending opposite to the first strap portion and connecting laterally the one end of the magnetic tunnel junction to a second selection transistor; comprising
during a writing procedure
passing a heating current in said first and second strap portions via the first and second selection transistors for heating said magnetic tunnel junction to a high temperature threshold;
after the magnetic tunnel has reached the high temperature threshold, switching the magnetization of the storage layer.

13. The method according to claim 12, wherein said switching the magnetization of the storage layer comprises passing a field current in said first and second strap portions via the first and second selection transistors.

14. The method according to claim 12, wherein the cell further comprising a field line, said switching the magnetization of the storage layer comprising passing a field current in the field line.

15. The method according to claim 12, wherein the cell further comprising a bit line connected to the other end of the magnetic tunnel junction, said switching the magnetization of the storage layer comprising passing a spin polarized write current across the magnetic tunnel junction, via at least one of the selection transistors.

* * * * *